United States Patent
Rumsey

(10) Patent No.: US 6,984,894 B2
(45) Date of Patent: Jan. 10, 2006

(54) SEMICONDUCTOR PACKAGE HAVING A PARTIAL SLOT COVER FOR ENCAPSULATION PROCESS

(75) Inventor: Brad D. Rumsey, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/421,133

(22) Filed: Apr. 23, 2003

(65) Prior Publication Data

US 2003/0178731 A1 Sep. 25, 2003

Related U.S. Application Data

(62) Division of application No. 09/520,260, filed on Mar. 7, 2000, now Pat. No. 6,577,015.

(51) Int. Cl.
*H01L 23/495* (2006.01)
*H01L 23/06* (2006.01)
*H05K 7/20* (2006.01)
*H05K 7/06* (2006.01)

(52) U.S. Cl. .................. 257/774; 257/783; 257/676; 257/784; 257/786; 257/684; 257/724; 257/668; 257/691; 257/796; 257/673; 361/707; 361/719; 361/783; 29/832; 29/841; 174/260

(58) Field of Classification Search .................. 257/774, 257/676, 691, 666, 693, 678, 532, 787, 783, 257/673, 784, 786, 684, 724, 668, 687; 361/707, 361/719, 783, 760, 748–751, 767; 29/832, 29/841; 174/260, 255
See application file for complete search history.

(56) References Cited

U.S. PATENT DOCUMENTS

| 5,173,766 | A |   | 12/1992 | Long et al. ............... 257/687 |
| 5,353,195 | A | * | 10/1994 | Fillion et al. ............. 361/760 |
| 5,571,027 | A |   | 11/1996 | Roebuck et al. ........... 439/264 |
| 5,585,666 | A | * | 12/1996 | Imamura .................. 257/668 |
| 5,854,740 | A |   | 12/1998 | Cha ........................ 361/760 |
| 5,920,118 | A | * | 7/1999  | Kong ....................... 257/684 |
| 6,127,726 | A |   | 10/2000 | Bright et al. .............. 257/691 |
| 6,224,936 | B1|   | 5/2001  | Gochnour et al. ........... 427/96 |
| 6,232,148 | B1|   | 5/2001  | Ma et al. .................. 438/112 |
| 6,246,247 | B1|   | 6/2001  | Eldridge et al. ........... 324/761 |
| 6,294,825 | B1| * | 9/2001  | Bolken et al. ............. 257/676 |
| 6,300,163 | B1|   | 10/2001 | Akram ..................... 438/108 |
| 6,300,165 | B2|   | 10/2001 | Castro ..................... 438/118 |
| 6,331,936 | B1|   | 12/2001 | Corisis et al. ............ 361/784 |
| 6,362,964 | B1| * | 3/2002  | Dubhashi et al. .......... 361/707 |
| 6,373,127 | B1|   | 4/2002  | Baudouin et al. .......... 257/676 |
| 6,388,199 | B1|   | 5/2002  | Jiang et al. .............. 174/255 |
| 6,781,248 | B2| * | 8/2004  | Hui et al. ................. 257/787 |
| 2002/0020908 | A1| * | 2/2002 | Prindiville et al. ........ 257/693 |

FOREIGN PATENT DOCUMENTS

| EP | 0698920 A2 | * | 2/1996 |
| JP | 8-317605 |   * | 11/1996 |

* cited by examiner

*Primary Examiner*—Alexander Oscar Williams
(74) *Attorney, Agent, or Firm*—Fletcher Yoder

(57) ABSTRACT

A system and method for encapsulating an integrated circuit package. More specifically, a system and method for encapsulating a board-on-chip package is described. A strip of material is disposed on one end of the slot in the substrate to control the flow of the molding compound during the encapsulation process.

17 Claims, 5 Drawing Sheets

SEMICONDUCTOR PACKAGE HAVING A PARTIAL SLOT COVER FOR ENCAPSULATION PROCESS

This application is a divisional of U.S. application Ser. No. 09/520,260, filed Mar. 7, 2000, which issued as U.S. Pat. No. 6,577,015 on Jun. 10, 2003.

BACKGROUND OF THE INVENTION

1. Field of the Invention

The present invention relates generally to semiconductor fabrication and, more particularly, to BOC (Board-on-Chip) FBGA (fine-pitch ball grid array) packages.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications. Such applications include personal computers, control systems, telephone networks, and a host of consumer products. As is well known, microprocessors are essentially generic devices that perform specific functions under the control of a software program. This program is stored in a memory device coupled to the microprocessor. Devices of these types are formed from a plurality of electrical circuits placed together in what is known in the art as a package. The packaging of electrical circuits is a key element in the technological development of any device containing electrical components. Many electrical circuits are packaged for surface mounting, and Fine-Pitch Surface Mount Technology (FPT) and Pin Grid Array (PGA) technology are well developed areas of this type of packaging technology. In addition, an emerging packaging method has been developed using Ball Grid Array (BGA) technology.

In forming surface mount packages, one important step is that of encapsulating the microchip or die and substrate. Proper flow of the encapsulating material is required to obtain maximum uniformity in the characteristics of the molded encapsulating material. Non-uniform material characteristics in the molded encapsulating material can create undesired stresses resulting in cracking of the encapsulating body. Delamination can also result from non-uniformity in the molded encapsulating material. Bridging of electrical pathways can be another resultant of an improperly formed encapsulating molds. Thus, the encapsulating process plays an important role in formation of packaged surface mount devices.

Another key area in surface mount technology is chip size. Smaller microchip devices mean less space used by each component. Significant research and development has been devoted to finding ways to get more and more capabilities into smaller areas. Engineers have been challenged with finding ways to increase hardware capabilities, with memory capacity being one area in which board geography is at a particular premium. However, regardless of whether FPT, PGA, or BGA is implemented, surface mount technologies are limited by the space available on the ceramic substrate or printed circuit board (PCB). As a result, the amount of memory will disadvantageously be limited by the dimensions of the mounting surface. Accordingly, any reduction in surface mount component size may be beneficial.

The present invention may be directed to addressing one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present invention, there is provided a system comprising a semiconductor device, a substrate disposed with a slot there through, and an apparatus for encapsulating the semiconductor package. A material is disposed on the substrate to cover one end of the slot.

According to another embodiment of the present invention, there is provided a semiconductor package comprising a semiconductor device and a substrate disposed with a slot there through. A material is disposed on the substrate to cover one end of the slot.

According to still another embodiment of the present invention, there is provided a method of forming a molded semiconductor package. The method comprises: forming a slot in a substrate; covering one end of the substrate; attaching a semiconductor device to the substrate; electrically coupling the semiconductor device to the substrate and encapsulating the semiconductor package by flowing a molding compound from one surface of the substrate through the slot to the second surface of the substrate.

DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
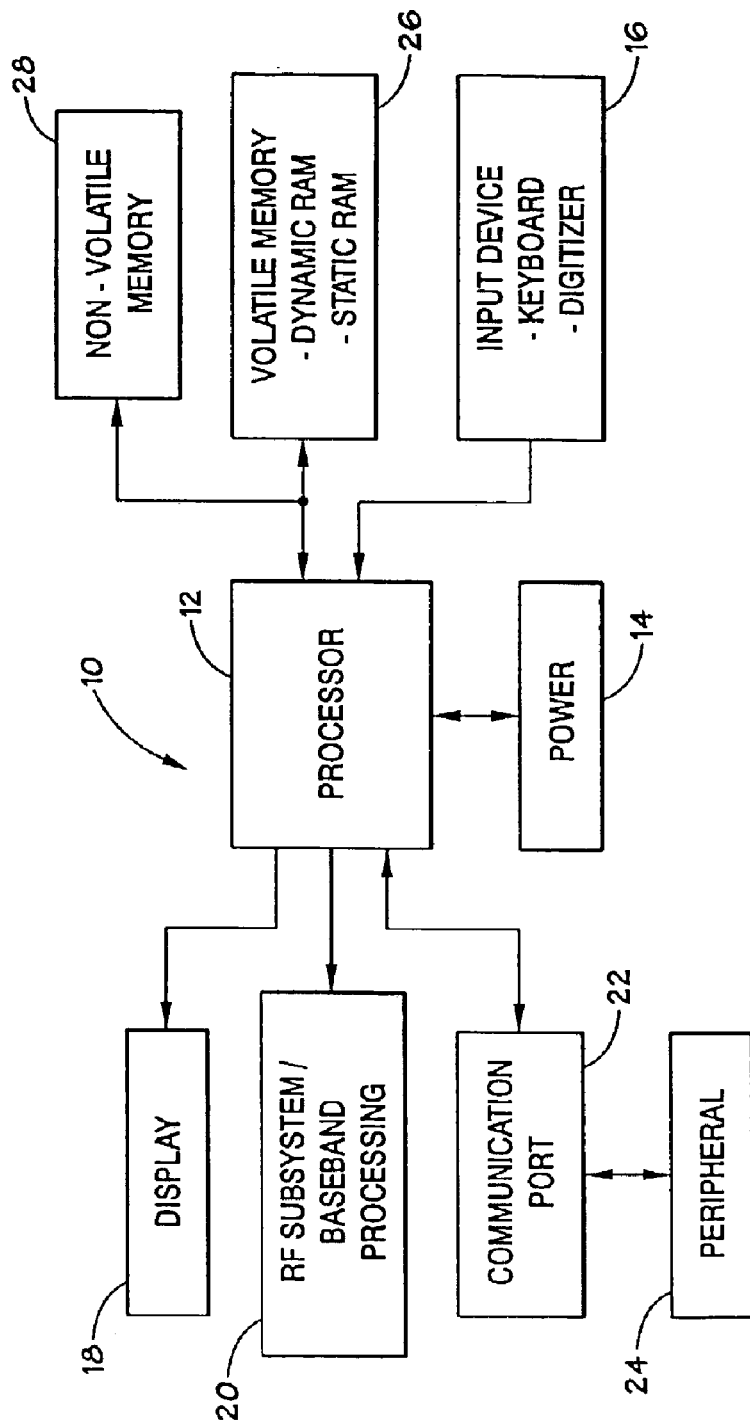
FIG. 1 illustrates a block diagram of an exemplary processor-based device in accordance with the present invention.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The nonvolatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

Figure 2:
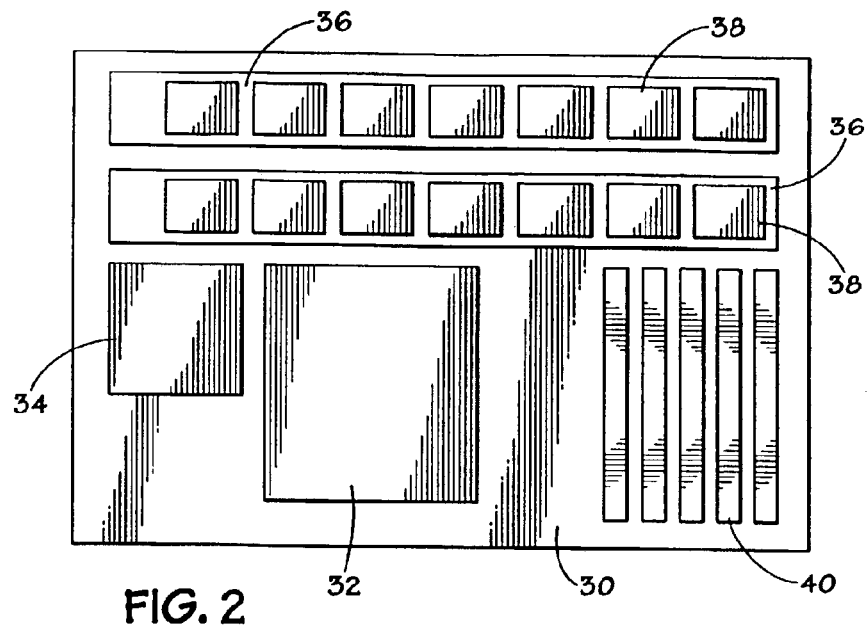
FIG. 2 illustrates a plan view of a circuit board having various devices employed thereon.

Referring to FIG. 2, a circuit board 30 is shown having various devices and connections coupled to its surface. A microprocessor 32 is shown along with a ROM device 34 and a set of memory modules 36, each containing a plurality of RAM chips 38. A plurality of connections or ports 40 are also located on the circuit board 30 allowing for connection to various peripheral devices and expansion modules. In a computer application, for example, such devices and expansion modules might include sound cards, video cards, additional memory modules or connections for input and output peripherals. While the present embodiment has a direct relation to memory chips such as the ROM device 34 and RAM chip 38, the techniques described below, may be applied to any device package having similar mounting characteristics including, if desired, the microprocessor 32.

Figure 3:
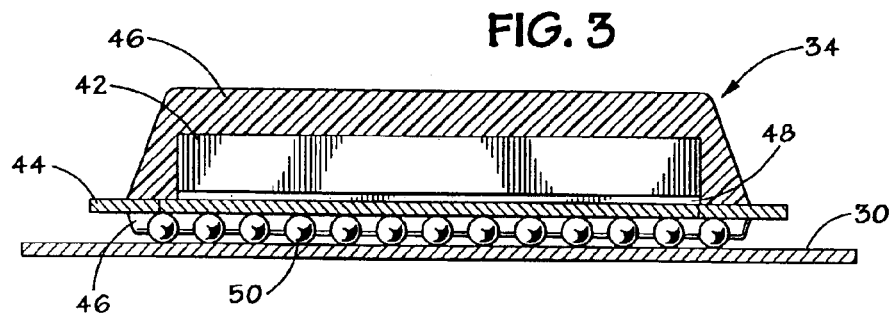
FIG. 3 illustrates a cross-section of a BGA device attached to a circuit board.

Referring to FIG. 3, ROM device 34 is depicted as a typical BGA device. The BGA device includes a chip or die 42 adhered to a substrate 44. The die is a semiconducting device typically having a plurality of transistors, capacitors, and/or electrical connections. Die 42 is attached to substrate 44 by adhesive 48. The adhesive 48 in this particular embodiment is tape.

To protect the die 42 from external elements such as moisture, dust, or impact, the die 42 is typically encapsulated in a molding compound 46. The molding compound 46 is typically a resin. The molding compound 46 is also disposed on the backside of the substrate 44 to protect bond wire connections (not shown) between the die 42 and substrates 44, as will be described below herein. The molding compound 46 on the backside of substrate 44 will also reduce bowing of the substrate 44 caused by the molding compound 46 on the frontside of substrate 44.

A plurality of conductive balls 50 are arranged in an array on the surface of the substrate opposite the die 42. The conductive balls 50 are typically formed of solder. The conductive balls 52 are electrically connected through the substrate to wire bonds (not shown) extending from the die. The device 34 is placed onto a circuit board 30 having bond pads (not shown). The bond pads are arranged to mirror the array pattern of the conductive balls 50. The device 34 is attached to the circuit board 30 by reflowing the solder to create an electrical connection between the conductive balls 50 and the bond pads of the circuit board 30. While FIG. 3 depicts a typical BGA device, it should be evident that the techniques described herein may be applied to devices which are subject to other surface mounting techniques.

Figure 4:
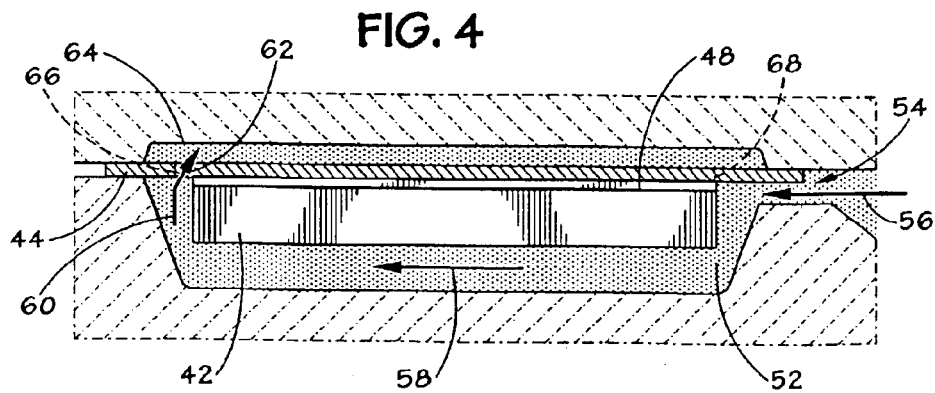
FIG. 4 illustrates a partial cross-section of a FBGA device in elevation view during the molding process.

Referring to FIG. 4, the substrate 44 is typically adhered to die 42 by adhesive tape 48. The substrate 44 and die 42 are placed in a molding cavity 52 with the die 42 on the bottom side. A molding compound is introduced into the molding cavity 52 by a mold gate 54 located at an edge of the substrate 44. It is desirable that the molding compound flows as shown by directional arrows 56, 58, and 60. The molding compound first flows in through the mold gate 54 in the direction indicated by arrow 56. The molding compound flows around the die 42 as indicated by arrow 58, and then up through the slot 62 into the molding cavity 64 as indicated by directional arrow 60. The slot 62 is a section which has been cut through the substrate 44, as is better illustrated in FIGS. 5–9. The dashed lines 66 and 68 in the substrate 44 in FIG. 4 represent the ends of the slot 62. The slot 62 is filled with the molding compound to provide protection for the electrical connects between the die 42 and the substrate 44. Generally, the electrical connections are made by bond wires (not shown), but other suitable means of providing electrical conductivity may be used.

Figure 5:
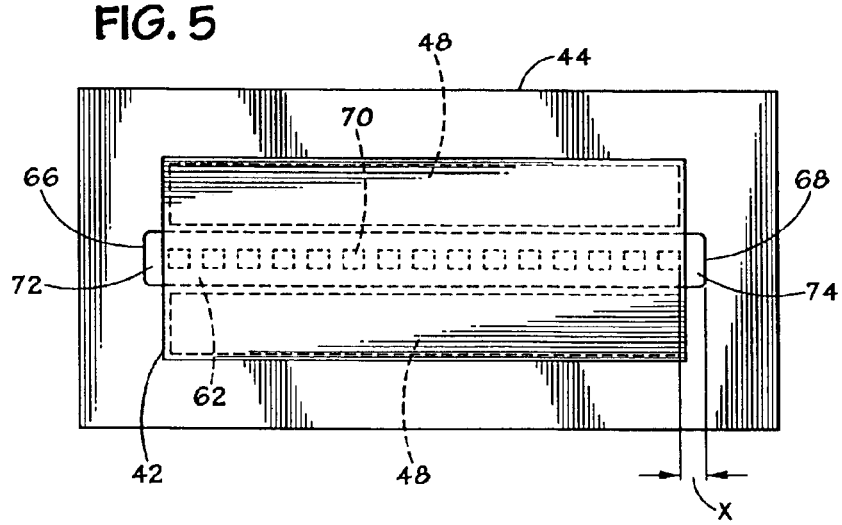
FIG. 5 illustrates a frontside plan view of a typical die mounted substrate.

FIG. 5 illustrates a top plan view of a typical semiconductor device. The die 42 is coupled to the substrate 44 using adhesive tape 48. The substrate 44 contains a slot 62. When the die 42 is coupled to the substrate 44, it is mounted in such a way that bond pads 70 on the backside of die 42 are aligned over the slot 62. This enables the die 42 to be electrically coupled to the substrate 44 using bond wires (not shown). The die 42 is typically mounted to the substrate 44 in such a way as to leave portions of the slot 62 exposed. The reason for leaving the slot 62 partially exposed is to facilitate the encapsulation process as shown in FIG. 4. Thus, in FIG. 5 the die 42 is mounted in such a way as to leave slot end 66 and slot end 68 exposed. However, in this configuration the flow path of the molding compound is not controlled since the molding compound may flow from the die side of the substrate 44 to the backside of the substrate 44 through slot region 72 or slot region 74 during the encapsulation process. Disadvantageously, the lack of flow path control may lead to improper cooling, incomplete mold fill, mold bleed, discontinuities in the final mold, and/or electrical bridging.

To create a uniform controlled flow path for the molding compound, one end of the slot 62 may be covered. However, due to design rules in the wire bond process, it may not be acceptable to move the die 42 in such a way as to cover one end of the slot 62 completely. Specifically, a certain distance X is necessary between the first bond pad 70 and the ends of the slot 62 so that the capillary used in the automated bonding process may reach the bond pads 70 without being driven into the edges of the substrate 44. The bonding process is discussed more fully herein with reference to FIG. 9.

Figure 6:
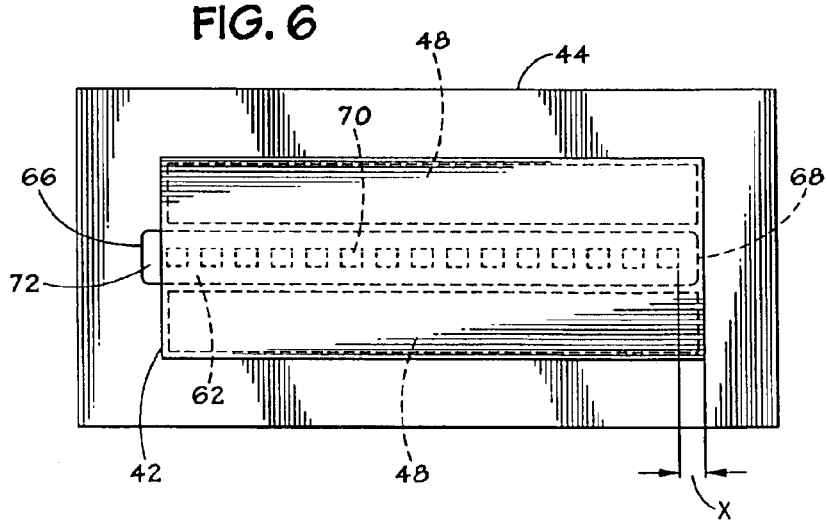
FIG. 6 illustrates an alternate embodiment of a frontside plan view of a typical die mounted substrate.

One solution to this problem is illustrated in FIG. 6. Rather than simply shift the die 42 to cover the slot end 68, and thereby create a uniform and controlled flow path for the molding compound, the die 42 is increased in size in order to cover distance X. While this solution will allow the proper clearance necessary for the wire bond process, it wastes valuable space on the die 42 by providing space which cannot be occupied by a bond pad 70. During the encapsulation process, all molding compound will flow uniformly through an opening 72 in the slot 62.

Figure 7:
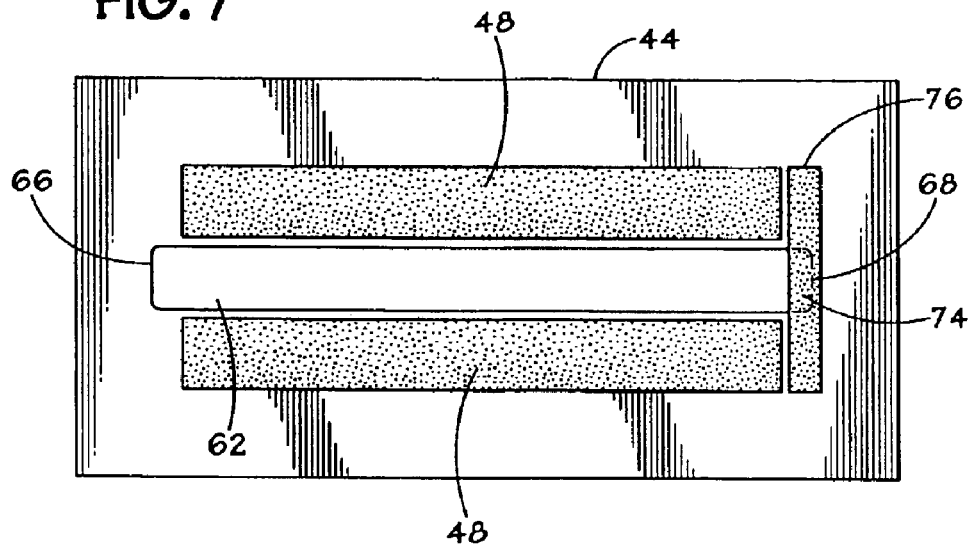
FIG. 7 illustrates a frontside plan view of an exemplary embodiment of a substrate in accordance with the present invention.

Advantageously, the embodiment described below provides a uniform controlled flow path during the encapsulation process without wasting die size. FIG. 7 illustrates a top plan view of this embodiment. In this illustration, the substrate 44 is shown without the die 42 attached. As can be seen, the slot 62 is cut through the substrate 44. Adhesive tape 48 is disposed on either side of the slot 62 to couple the die 42 to the substrate 44. In this embodiment, an additional strip of tape 76 is placed over the opening 74 of the slot 62. The covered slot opening 74 and the width of tape 76 are at least as wide as distance X (illustrated in FIGS. 5 and 6) to provide the space to allow the capillary to clear the substrate during the wire bond process.

Figure 8:
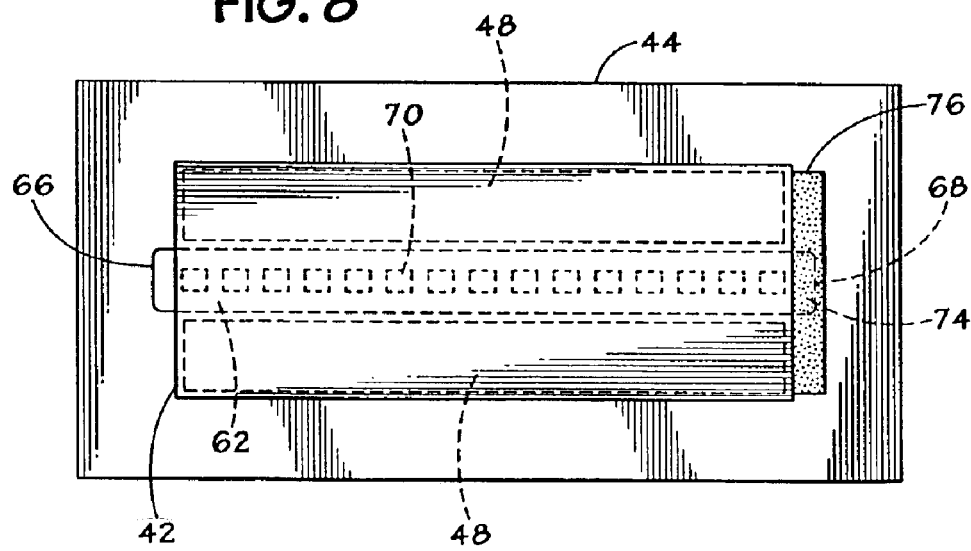
FIG. 8 illustrates a frontside plan view of an exemplary embodiment of a die mounted substrate in accordance with the present invention.

FIG. 8 illustrates the same top plan view of the substrate 44 as illustrated in FIG. 7. However, the die 42 is now attached to the substrate 44. As can be seen, bond pads 70 may be disposed on the backside of the die 42 without concern of wire bond process design rules. Thus, rather than increasing the size of the die 42 to cover the end slot opening 74 to ensure a controlled flow path for the molding compound during the encapsulation process, a strip of tape 76 is used.

Figure 9:
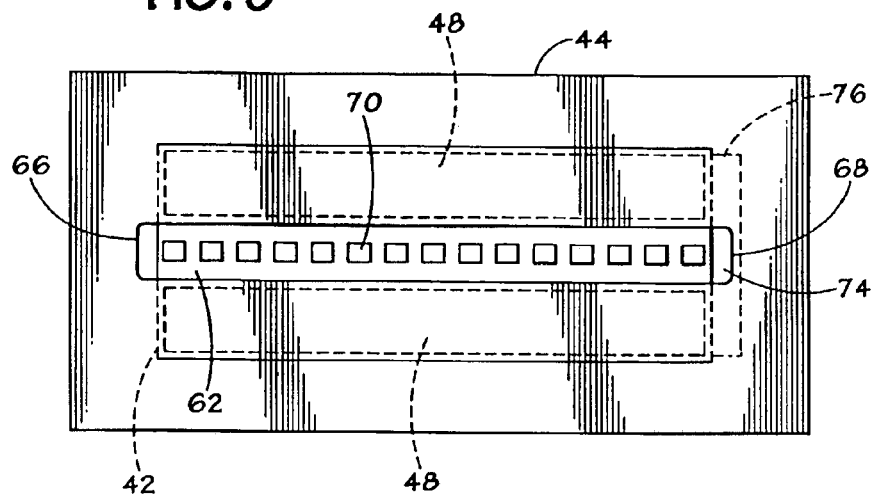
FIG. 9 illustrates a backside plan view of an exemplary embodiment of a die mounted substrate in accordance with the present invention.

FIG. 9 illustrates a backside view of the substrate 44 as depicted in FIG. 8. As can be seen through the slot 62 in the substrate 44, bond pads 70 are arranged in such a way as to allow bond wires (not shown) to electrically couple the die 42 to the substrate 44. During the wire bond process, an automated bond machine is used to attach gold wires from pads 70 on the die 42 to the substrate 44. The capillary on the automated bonding equipment requires that nothing obstruct be path to the bond pads 70. Thus, the wall edges created in the substrate 44 by the slot 62 are advantageously at least a distance X from the center of the outermost pad 70.

Figure 10:
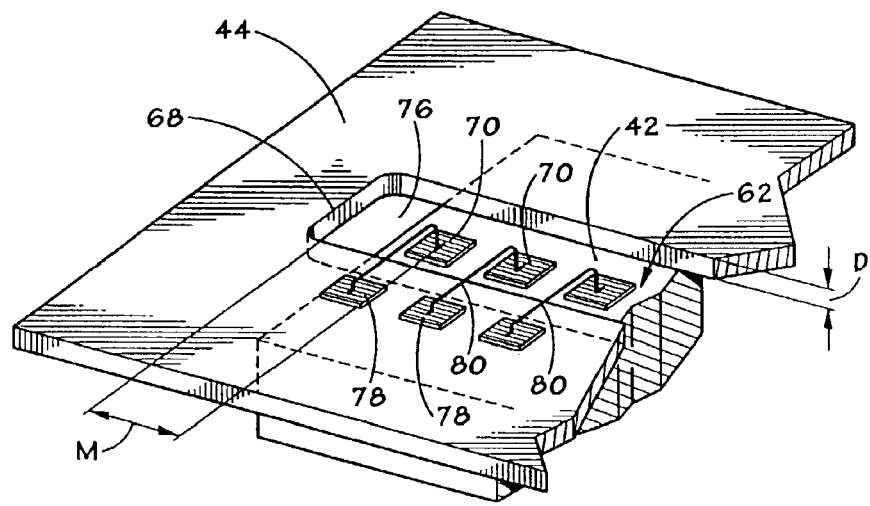
FIG. 10 illustrates a backside perspective view of an exemplary embodiment of a die mounted substrate in accordance with the present invention.

FIG. 10 illustrates a backside perspective view of the substrate 44. As can be seen, pads 70 on the die 42 are electrically coupled to bond pads 78 on the substrate 44 by bond wires 80. To facilitate the bonding process, an automated bonder is typically used to attach bond wires 80 to the bond pads 70 and 78. Because the slot 62 has some depth D associated with it that is equal to a thickness of the substrate 44, it is useful to ensure that the bonding capillary has sufficient clearance from the slot edge 68 to ensure that the capillary does not hit the substrate during the bonding process. Thus, wire bond design rules specify a minimum distance M from the edge of a wall, such as it created by the slot 62 in the substrate 44, to bond pad 70. The minimum distance M will depend on the depth D of the cavity and the particular capillary used by the wire bond equipment. To adhere to the wire bond requirements, without wasting die space, tape 76 may be applied to space the die 42 adequately from the slot edge 68 without creating an opening to allow for an uncontrolled flow path of the molding compound.

In an alternate embodiment, other materials may be used to prevent leaving an unwanted opening in the slot 62. For instance, if the substrate 44 is a molded substrate, it may be possible to provide a small shelf at the end of the slot 62 which also blocks the end of the cavity 62 using the same material from which the substrate 44 is manufactured.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A semiconductor package comprising:
   a semiconductor device having a first surface and a second surface;
   a substrate having a first surface and a second surface and having a slot disposed through the substrate, the first surface of the substrate being coupled to the second surface of the semiconductor device such that the slot is partially covered by the semiconductor device, and wherein the ends of the slot are left open by the semiconductor device;
   a material covering one end of the slot; and
   a molding compound disposed about at least a portion of the semiconductor package;
   wherein the material covering the one end of the slot is configured to prevent the flow of the molding compound through the one end of the slot.

2. The semiconductor package, as set forth in claim 1, wherein the semiconductor device comprises a memory device.

3. The semiconductor package, as set forth in claim 1, comprising a plurality of conductive pads disposed on the second surface of the semiconductor device.

4. The semiconductor package, as set forth in claim 3, wherein the second surface of the semiconductor device is coupled to the first surface of the substrate so as to align the plurality of conductive pads with the slot, the conductive pads being visible through the slot from the second surface of the substrate.

5. The semiconductor package, as set forth in claim 1, wherein the semiconductor device is electrically coupled to the substrate.

6. The semiconductor package, as set forth in claim 4, wherein the semiconductor device is electrically coupled to the substrate by a plurality of wire bonds coupled between the conductive pads on the second surface of the semiconductor device and a plurality of conductive pads disposed on the first surface of the substrate.

7. The semiconductor package, as set forth in claim 1, wherein the substrate is coupled to the semiconductor device by an adhesive material.

8. The semiconductor package, as set forth in claim 7, wherein the adhesive material comprises tape.

9. The semiconductor package, as set forth in claim 1, wherein the material covering one end of the slot comprises tape.

10. The semiconductor package, as set forth in claim 9, wherein the tape is disposed on the first surface of the substrate.

11. The semiconductor package, as set forth in claim 1, wherein the material covering one end of the slot comprises a substrate material.

12. The semiconductor package, as set forth in claim 1, wherein the material covering one end of the slot comprises a non-conductive material, wherein the non conductive material is disposed on the first surface of the substrate.

13. The semiconductor package, as set forth in claim 1, wherein the molding compound comprises a resin.

14. The semiconductor package, as set forth in claim 1, wherein the molding compound is disposed on the first surface of the semiconductor device and the first surface of the substrate.

15. The semiconductor package, as set forth in claim 1, wherein the molding compound is disposed through the slot and onto the second surface of the substrate.

16. The semiconductor package, as set forth in claim 15, wherein the molding compound is disposed to cover the plurality of conductive pads on the second side of the semiconductor device.

17. The semiconductor package, as set forth in claim 1, comprising a ball grid array operatively coupled to the semiconductor device to route electrical signals from the semiconductor device to an external device.

* * * * *